United States Patent
Mozer et al.

(10) Patent No.: US 10,064,308 B2
(45) Date of Patent: Aug. 28, 2018

(54) MECHANICAL MOUNTING SYSTEM FOR A DISPLAY DEVICE

(71) Applicant: THALES, Courbevoie (FR)

(72) Inventors: Laurent Mozer, Merignac (FR); Daniel Laret, Merignac (FR); Jean-Marie Goy, Merignac (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/566,670

(22) PCT Filed: Apr. 13, 2016

(86) PCT No.: PCT/EP2016/058060
§ 371 (c)(1),
(2) Date: Oct. 13, 2017

(87) PCT Pub. No.: WO2016/166123
PCT Pub. Date: Oct. 20, 2016

(65) Prior Publication Data
US 2018/0116072 A1    Apr. 26, 2018

(30) Foreign Application Priority Data
Apr. 17, 2015 (FR) ...................... 15 00805

(51) Int. Cl.
*H05K 7/16* (2006.01)
*H05K 7/14* (2006.01)
(Continued)

(52) U.S. Cl.
CPC ............. *H05K 7/16* (2013.01); *H05K 5/0017* (2013.01); *H05K 5/0217* (2013.01);
(Continued)

(58) Field of Classification Search
CPC ...... H05K 7/16; H05K 5/0217; H05K 5/0017; H05K 7/1412; G06F 1/184; G06F 1/187; A47B 46/005
See application file for complete search history.

(56) References Cited

U.S. PATENT DOCUMENTS

| | | | |
|---|---|---|---|
| 6,215,664 B1 * | 4/2001 | Hernandez | G06F 1/181 361/725 |
| 6,538,879 B2 * | 3/2003 | Jiang | G06F 1/184 211/26 |

(Continued)

FOREIGN PATENT DOCUMENTS

| | | |
|---|---|---|
| EP | 2 503 865 A1 | 9/2012 |
| FR | 2 938 022 A1 | 5/2010 |

(Continued)

*Primary Examiner* — Dimary Lopez Cruz
*Assistant Examiner* — Abhishek Rathod
(74) *Attorney, Agent, or Firm* — Baker & Hostetler LLP

(57) ABSTRACT

Mechanical mounting devices for an electronic housing in a frame are provided, the electronic housing comprising a front face, a rear face, a bottom and two lateral faces, the frame comprising an opening. The electronic housing comprises, on each lateral face, a mechanical cam having a quarter-circle form, one of the two ends of the cam being terminated by a triangular point the end bearing the point being disposed close to the bottom, the second end being disposed along the front face. The bottom of the frame comprises a bottom abutment parallel to the front face. The opening of the frame comprises two guiding pins disposed on either side of the uprights of the opening and arranged such that each cam can be displaced in rotation on the pin which corresponds to it during the phase of mounting of the electronic housing in the frame.

4 Claims, 4 Drawing Sheets

(51) Int. Cl.
  *H05K 5/00* (2006.01)
  *H05K 5/02* (2006.01)
  *A47B 46/00* (2006.01)
  *G06F 1/18* (2006.01)

(52) U.S. Cl.
  CPC .......... *H05K 7/1412* (2013.01); *A47B 46/005* (2013.01); *G06F 1/184* (2013.01); *G06F 1/187* (2013.01)

(56) References Cited

U.S. PATENT DOCUMENTS

| | | | | |
|---|---|---|---|---|
| 8,955,926 B2* | 2/2015 | Gong | ...................... | G06F 1/187 312/223.2 |
| 9,665,135 B2* | 5/2017 | Wong | ...................... | G06F 1/182 |
| 2002/0190187 A1* | 12/2002 | Yuan | ...................... | G06F 1/184 248/694 |
| 2004/0184243 A1* | 9/2004 | Mease | ...................... | G06F 1/184 361/725 |
| 2005/0018387 A1* | 1/2005 | Chou | ...................... | G06F 1/184 361/679.02 |
| 2007/0228904 A1* | 10/2007 | Williams | ............. | A47B 46/005 312/327 |
| 2008/0062635 A1* | 3/2008 | Chang | ...................... | G06F 1/187 361/679.39 |
| 2010/0055966 A1* | 3/2010 | Sontag | .................. | B64D 43/00 439/374 |
| 2012/0181304 A1* | 7/2012 | Kim | ...................... | F25D 23/126 222/182 |

FOREIGN PATENT DOCUMENTS

| | | |
|---|---|---|
| FR | 2 967 863 A1 | 5/2012 |
| WO | 2008/040783 A1 | 4/2008 |

* cited by examiner

PROFILE VIEW  REAR VIEW

MECHANICAL MOUNTING SYSTEM FOR A DISPLAY DEVICE

CROSS-REFERENCE TO RELATED APPLICATIONS

This application is a National Stage of International patent application PCT/EP2016/058060, filed on Apr. 13, 2016, which claims priority to foreign French patent application No. FR 1500805, filed on Apr. 17, 2015, the disclosures of which are incorporated by reference in their entirety.

FIELD OF THE INVENTION

The field of the invention is that of mechanical mounting systems for electronic equipment items in frames making it possible to ensure a secure placement and connection. The preferred field of application is that of aeronautics and in particular that of aircraft instrument panels comprising several display screens. However, this device can have a large number of applications, particularly in all the fields of professional electronics which require rapid and safe placements.

BACKGROUND

The mounting of an electronic equipment item, generally a display device, in an instrument panel, is not a simple problem for several reasons. The rear face of the equipment item is inaccessible during the mounting and once placement has been performed. The equipment item has a weight and a volume that are sufficient for the handling by an operator not to be easy. Moreover, the electrical connectors used generally comprise several tens of contacts and, consequently, the mounting thereof requires both great precision and a certain insertion force. Finally, the placement, both mechanical and electrical, must be perfectly ensured, given the constraints of safety and reliability inherent to this type of embedded hardware.

A first possible technical solution consists in placing, on the instrument panel, a mechanical "seat" comprising mechanical translational guiding means making it possible to correctly pre-position the equipment item when fixing it onto the instrument panel. This seat also comprises a female connector. The equipment item comprises the corresponding male connector. The guiding means and the positioning tolerances are calculated such that the connection of the two connectors is done perfectly during the mounting of the equipment item. Thus, the electrical connection and the mechanical connection are simultaneously assured. It will be understood that such a system is necessarily expensive and complex given the positioning tolerances in particular.

A second solution consists in performing the electrical connection and the mechanical connection separately. In this case, the female connector of the instrument panel is mounted on a sufficiently long electrical strand. The connector of the equipment item is first of all fixed onto this female connector. Once the electrical connection is established, the electronic equipment item, is mounted in the instrument panel. The drawback of this solution is that, to totally separate the two operations of mechanical and electrical connection, it is necessary to have a significant strand length so as to be able to totally extract the equipment item when mounting the electrical connector. Since the equipment item is necessarily mounted blind in the instrument panel, it is then difficult to perfectly check the placement of the strand behind the equipment item. Similarly, on extracting the equipment item, care must be taken not to damage the strand.

SUMMARY OF THE INVENTION

The mechanical mounting system according to the invention does not present these drawbacks. Each lateral face of the electronic equipment item comprises a cam which ensures both the holding of the equipment item in the instrument panel before connection and the guiding thereof during the mounting of the equipment item in the instrument panel. More specifically, the subject of the invention is a mechanical mounting device for an electronic housing in a frame, said electronic housing comprising a front face, a rear face, a bottom and two lateral faces, the frame comprising an opening of dimensions similar to those of the front face, characterized in that:
  the electronic housing comprises:
    on each lateral face, a mechanical cam having a substantially quarter-circle form, one of the two ends of the cam being terminated by a triangular point directed toward the interior of the circle, the section of said cam being substantially rectangular, the end bearing the point being disposed close to the bottom, the second end being disposed along the front face,
    on the bottom, a bottom abutment parallel to the front face so as to form, in the space situated between the bottom part of the front face and the bottom, a groove;
  the opening of the frame comprises two identical guiding pins disposed on either side of the uprights of the opening and arranged such that each cam can be displaced in rotation on the pin which corresponds to it during the phase of mounting of the electronic housing in the frame;
  the assembly consisting of the two cams, the bottom abutment and the guiding pins being arranged such that the position of the electronic housing in the frame comprises two rest positions, a first rest position in which the centering pins are situated at the triangular points of the cams and a second rest position in which the centering pins are situated at the second ends of the cams.

Advantageously, the position of the guiding pins and the form of the cam are arranged such that, during the transition from the first rest position to the second rest position, at no moment does the bottom of the electronic housing bear on zones situated in the vicinity of the opening.

Advantageously, the frame comprises a female connector mounted on a cable strand, the electronic housing comprising a corresponding male connector.

Advantageously, the frame is a part of an aircraft instrument panel and in that the electronic housing is an aeronautical display device.

BRIEF DESCRIPTION OF THE DRAWINGS

The invention will be better understood and other advantages will become apparent on reading the following description given in a nonlimiting way and through the attached figures in which.

DETAILED DESCRIPTION

Figure 1:
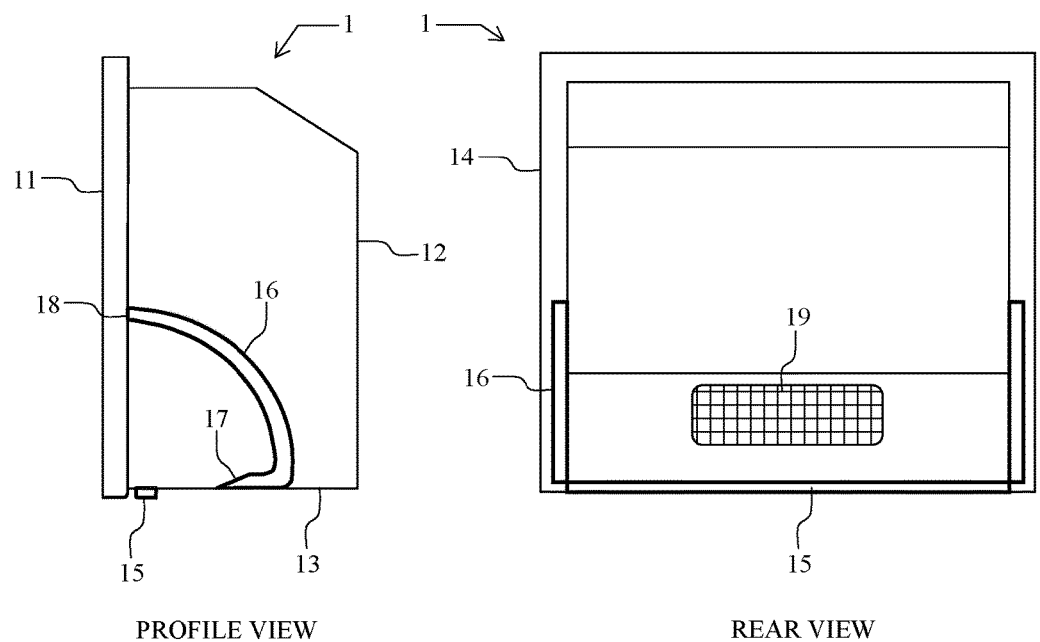
FIG. 1 represents a rear view and a profile view of an electronic housing according to the invention.

FIG. 1 represents a rear view and a profile view of a housing or of an electronic equipment item 1 equipped with a mechanical mounting device according to the invention. The electronic housing 1 comprises a front face 11, a rear face 12, a bottom 13 and two lateral faces 14. Generally, this equipment item is a display device and the front face is a flat display screen. The rear face 12 comprises an electronic connector 19.

This housing is intended to be mounted in a frame 20 comprising an opening 21. A partial perspective view represents this opening 21. Generally, the frame is that of an aircraft instrument panel. In the different figures, the frame is represented vertically. The inclination of the frame does not alter the mounting of the equipment item.

To be housed and fixed in the frame, the electronic housing 1 comprises a certain number of mechanical adaptations facilitating the mounting thereof in the frame. Each lateral face 14 comprises a mechanical cam 16 having a substantially quarter-circle form, one of the two ends of the cam being terminated by a triangular point 17 directed toward the interior of the circle. This form facilitates the insertion of the housing in the frame.

Figure 2:
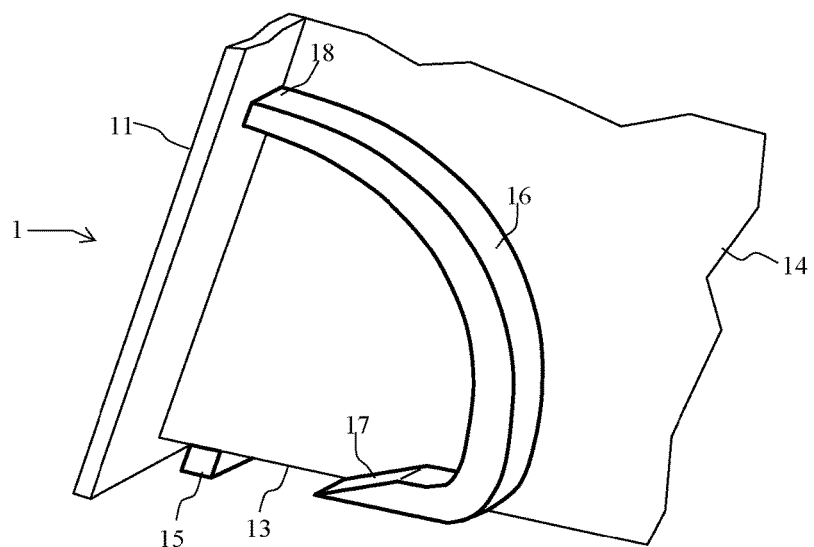
FIG. 2 represents a perspective view of a cam according to the invention.
Figure 3:
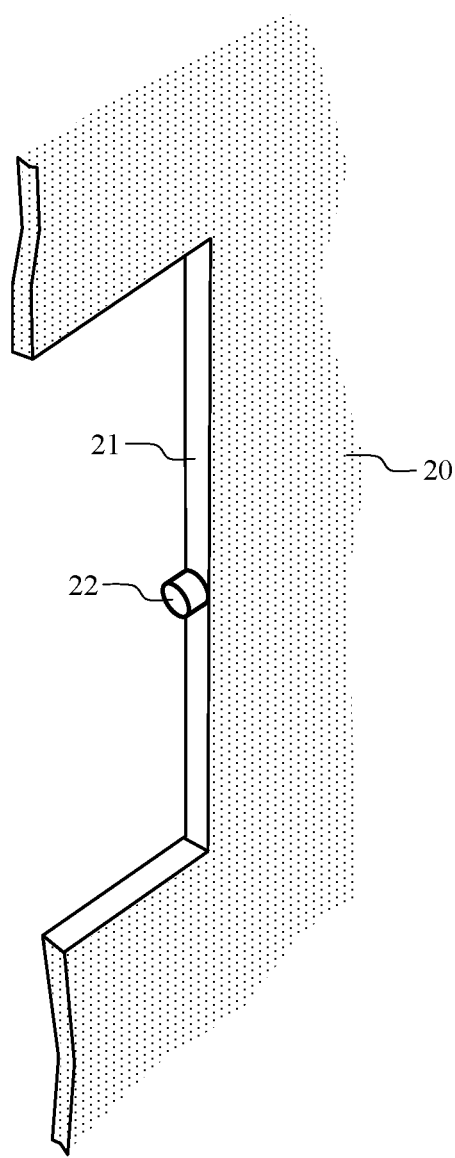
FIG. 3 represents a perspective view of the opening in the frame according to the invention.

This mechanical cam is represented on the perspective view of FIG. 2.

The section of the cam is substantially rectangular, the end bearing the point 17 being disposed close to the bottom 13 of the equipment item, the second end 18 being disposed along the front face 11. The general form of the cam is adapted according to the form, the volume and the center of gravity of the equipment item. The production of the cams can be done by machining directly in the lateral faces 14 of the housing. It is also possible to machine them independently, then fix them onto the lateral sides 14 of the housing.

The bottom 13 of the equipment item comprises a bottom abutment 15 parallel to the front face 11 so as to form, in the space situated between the bottom part of the front face and the bottom, a groove parallel to the bottom of the front face.

The opening 21 of the frame 20 comprises two identical guiding pins 22 disposed on either side of the uprights of the opening at the same height and arranged such that each cam can be displaced in rotation on the pin which corresponds to it during the phase of mounting of the electronic housing in the frame. These pins are advantageously of cylindrical form but other forms are possible. Here again, they can be machined in the bulk of the frame or added later.

The assembly consisting of the two cams 16, the bottom abutment 15 and the guiding pins 22 is arranged such that the position of the electronic housing 1 in the frame 20 comprises two rest positions, a first rest position in which the centering pins 22 are situated at the triangular points 17 of the cams 16 and a second rest position in which the centering pins 22 are situated at the second ends 18 of the cams 16. The first rest position allows the electrical connection and disconnection. The second rest position allows the mechanical fixing of the equipment item in the frame.

More specifically, the sequence for mounting the electronic housing 1 in the opening 21 of the frame 20 is described in FIGS. 4 to 7. In these figures, the arrows with shadows indicate the various movements of the housing and of the connector system.

Figure 4:
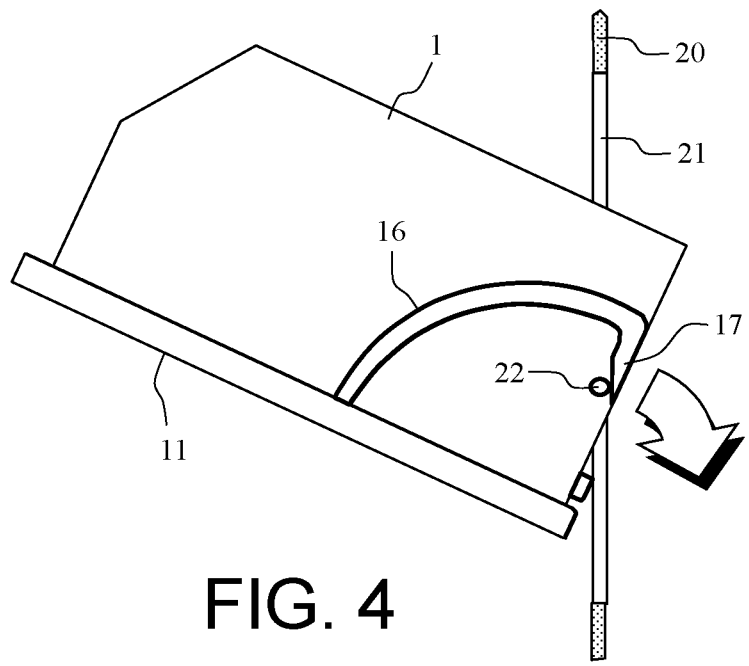
FIGS. 4 to 7 represent the sequence of mounting of the electronic housing in the frame.

As represented in FIG. 4, the frame 1 is positioned in the opening 21 such that the points 17 of the cams 16 pass over the two centering pins.

Figure 5:
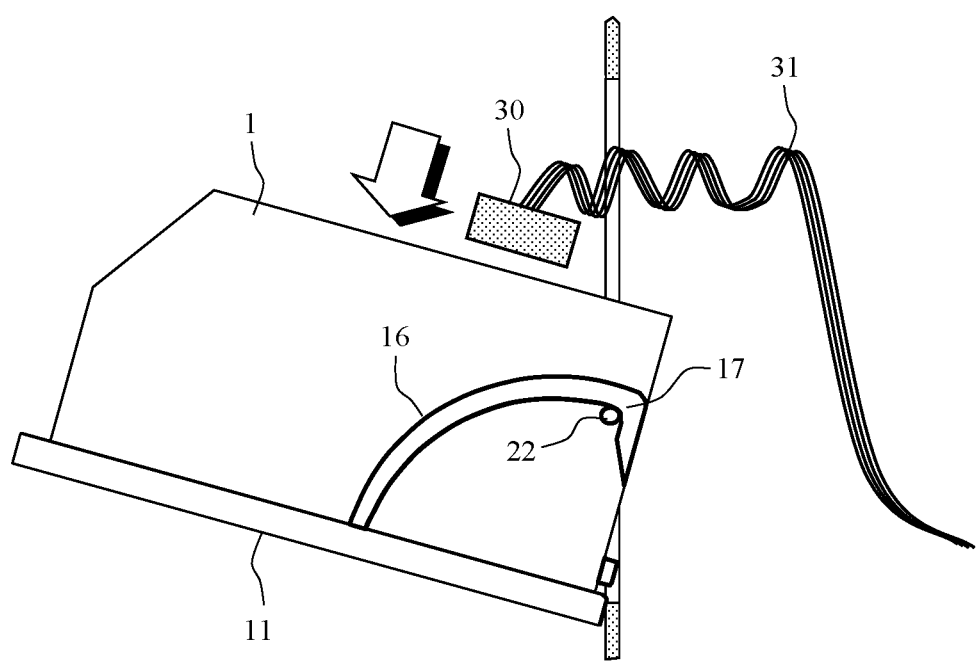

As can be seen in FIG. 5, the two cams 16 of the equipment item are therefore allowed to rest on the two centering pins 22. The pins 22 are situated at the triangular points 14 of the cams. The front face 11 of the equipment item is held in its bottom part by the abutment 15. With the equipment item being in this first rest position, it is easy to mount the connector 30 complementing the connector 19. This connector 30 is mounted on a strand 31 secured to the avionics system of the apparatus This connection is made easily in as much as the rear face of the equipment item is stable and easily accessible.

Figure 6:
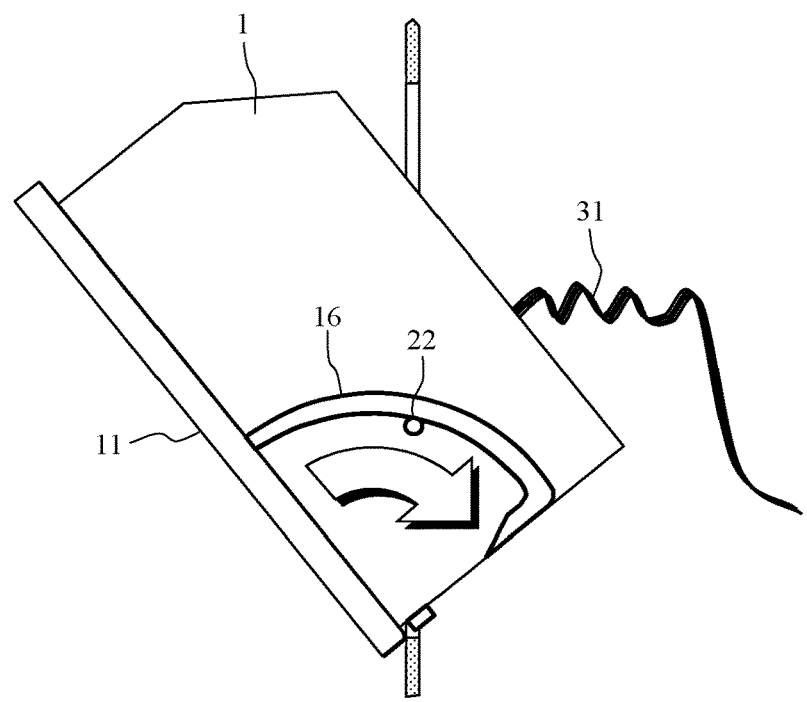

Thirdly, as can be seen in FIG. 6, the electronic housing 1 is tilted forward. In this phase, the equipment item pivots about the abutment 15. It is guided in this rotational movement by the two cams 16 which are displaced on their guiding pins 22. The position of the centering pins and the curvature of the cams are calculated such that, during the tilting, the equipment item does not bump into neighboring equipment items already installed on the instrument panel and close to the opening.

Figure 7:
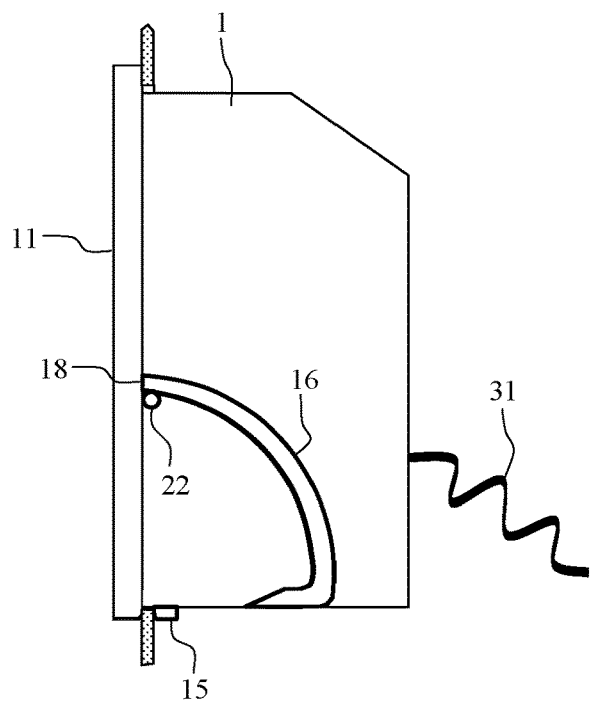

At the end of the movement, as can be seen in FIG. 7, the front face 11 of the equipment item is pressed over the opening 21. The end 18 of the cams 16 is situated at the centering pins 22. This is the second rest position of the housing.

All that remains is to hold the housing in its frame by various fixing means not represented in the different figures. These means are, for example, a fixing handle or fixing screws. The disconnection of the housing is done easily by reversing the connection sequence.

The main advantages of this mechanical device for mounting an electronic equipment item are as follows:
  use of simple and inexpensive mechanical means;
  great ease of mounting which can be done without tools;
  great mounting speed;
  great dependability of mounting of the equipment item in as much as it is perfectly guided during the fixing.

The invention claimed is:

1. A mechanical mounting device for an electronic housing in a frame, said electronic housing comprising a front face, a rear face, a bottom and two lateral faces the frame comprising an opening of dimensions similar to those of the front face, wherein:
  the electronic housing comprises:
    on each lateral face, a mechanical cam having a substantially quarter-circle form, one of the two ends of the cam being terminated by a triangular point directed toward the interior of the circle, the section of said cam being substantially rectangular, the end bearing the point being disposed close to the bottom, the second end being disposed along the front face,
    on the bottom, a bottom abutment parallel to the front face so as to form, a groove in the space situated between the bottom part of the front face and the bottom abutment;
  the opening of the frame comprises two identical guiding pins disposed on either side of the uprights of the opening and arranged such that each cam can be displaced in rotation on the pin which corresponds to it during the phase of mounting of the electronic housing in the frame;
  the assembly consisting of the two cams, the bottom abutment and the guiding pins being arranged such that the position of the electronic housing in the frame comprises two rest positions, a first rest position in which the centering pins are situated at the triangular points of the cams and a second rest position in which the centering pins are situated at the second ends of the cams.

2. The mounting device as claimed in claim 1, wherein the position of the guiding pins and the form of the cam are arranged such that, during the transition from the first rest position to the second rest position at no moment does the bottom of the electronic housing bear on zones situated in the vicinity of the opening.

3. The mounting device as claimed in claim 1, wherein the frame comprises a female connector mounted on a cable strand, the electronic housing comprising a corresponding male connector.

4. The mounting device as claimed in claim 3, wherein the frame is a part of an aircraft instrument panel and in that the electronic housing is an aeronautical display device.

\* \* \* \* \*